(12) United States Patent
Lee et al.

(10) Patent No.: US 11,304,337 B2
(45) Date of Patent: Apr. 12, 2022

(54) ELECTRONIC DEVICE COMPRISING HEAT TRANSFER MEMBER HAVING METAL PLATE AND HEAT TRANSFER MATERIAL COUPLED THERETO

(71) Applicant: Samsung Electronics Co., Ltd., Suwon-si (KR)

(72) Inventors: Haejin Lee, Suwon-si (KR); Kyungha Koo, Suwon-si (KR); Min Park, Suwon-si (KR); Jungje Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/001,017

(22) Filed: Aug. 24, 2020

(65) Prior Publication Data

US 2020/0389999 A1  Dec. 10, 2020

Related U.S. Application Data

(63) Continuation of application No. PCT/KR2019/002280, filed on Feb. 25, 2019.

(30) Foreign Application Priority Data

Feb. 23, 2018  (KR) .................. 10-2018-0021869

(51) Int. Cl.
*H05K 7/20* (2006.01)
*H05K 9/00* (2006.01)

(52) U.S. Cl.
CPC ......... *H05K 7/205* (2013.01); *H05K 7/20336* (2013.01); *H05K 7/20481* (2013.01); *H05K 9/00* (2013.01)

(58) Field of Classification Search
CPC ....... H05K 7/205; H05K 7/20481; H05K 9/00
See application file for complete search history.

(56) References Cited

U.S. PATENT DOCUMENTS

| | | | | |
|---|---|---|---|---|
| 4,631,214 A | * | 12/1986 | Hasegawa | H05K 9/00 174/388 |
| 6,921,859 B2 | * | 7/2005 | Hikita | H05K 9/00 174/381 |

(Continued)

FOREIGN PATENT DOCUMENTS

| | | | | |
|---|---|---|---|---|
| CN | 106686962 A | * | 5/2017 | ......... H05K 7/20445 |
| CN | 106686962 A | | 5/2017 | |

(Continued)

OTHER PUBLICATIONS

International Search Report dated May 31, 2019, issued in International Application No. PCT/KR2019/002280.

(Continued)

*Primary Examiner* — Leonard R Leo
(74) *Attorney, Agent, or Firm* — Jefferson IP Law, LLP

(57) ABSTRACT

Various embodiments of the present invention relate to an electronic device comprising a shielding structure which is arranged on the periphery of an electronic component, and which has an improved heat-radiating performance. The electronic device comprises: a circuit board; a non-elastic shielding member arranged on one surface of the circuit board, the non-elastic shielding member having a concave portion and an opening formed on a part of the concave portion; a processor contained in the concave portion and arranged on the one surface so as to correspond to the opening; a first heat transfer member arranged to contact the outer surface of the processor in at least a partial area of the opening; an elastic shielding member arranged on the periphery of the opening; and a second heat transfer member arranged to contact the first heat transfer member and the (Continued)

elastic shielding member. The second heat transfer member comprises a metal plate and a heat transfer material having a thermal conductivity higher than 1 W/mK. The heat transfer material may be coupled to the metal plate. The present invention may further comprise various other embodiments.

23 Claims, 13 Drawing Sheets

(56) References Cited

U.S. PATENT DOCUMENTS

| | | | |
|---|---|---|---|
| 8,951,629 B2* | 2/2015 | Min | H05K 7/20481 428/323 |
| 2014/0268578 A1 | 9/2014 | Dolci et al. | |
| 2015/0241936 A1* | 8/2015 | Hur | H05K 7/2039 361/679.54 |
| 2015/0264842 A1 | 9/2015 | Song et al. | |
| 2016/0227642 A1 | 8/2016 | Wanner et al. | |
| 2016/0301442 A1* | 10/2016 | Sohn | H05K 9/0032 |
| 2016/0338232 A1 | 11/2016 | Liu et al. | |
| 2017/0290209 A1 | 10/2017 | Craig | |
| 2018/0228063 A1 | 8/2018 | Dixon et al. | |
| 2018/0288908 A1 | 10/2018 | Lee et al. | |
| 2019/0364695 A1 | 11/2019 | Lee et al. | |
| 2020/0084921 A1* | 3/2020 | Seo | H05K 7/20481 |

FOREIGN PATENT DOCUMENTS

| | | |
|---|---|---|
| KR | 10-0743819 B1 | 7/2007 |
| KR | 10-1691797 B1 | 1/2017 |
| KR | 10-2017-0097541 A | 8/2017 |
| KR | 10-2018-0109615 A | 10/2018 |
| WO | 2017/065922 A1 | 4/2017 |
| WO | 2017/142286 A1 | 8/2017 |
| WO | 2018/182236 A1 | 10/2018 |

OTHER PUBLICATIONS

Written Opinion dated May 31, 2019, issued in International Application No. PCT/KR2019/002280.
Extended European Search Report dated Jul. 19, 2021, issued in European Patent Application No. 19756509.6.

* cited by examiner

ELECTRONIC DEVICE COMPRISING HEAT TRANSFER MEMBER HAVING METAL PLATE AND HEAT TRANSFER MATERIAL COUPLED THERETO

CROSS-REFERENCE TO RELATED APPLICATION(S)

This application is a continuation application of an International application No. PCT/KR2019/002280, filed on Feb. 25, 2019, which was based on and claimed the benefit of a Korean patent application number 10-2018-0021869, filed on Feb. 23, 2018, in the Korean Intellectual Property Office, the disclosure of each of which is incorporated by reference herein in its entirety.

TECHNICAL FIELD

Various embodiments of the disclosure relate to an electronic device including a shielding structure disposed around electronic parts and having high heat dissipation performance.

BACKGROUND ART

With advances in the performance of electronic parts disposed in electronic devices, the amount of heat that is generated by the electronic parts also continually increases. Heat generated by electronic parts may be a factor that causes malfunction of electronic devices, so there is continuous demand for technology for efficiently transmitting and discharging heat that is generated by electronic parts.

Further, electronic parts generate electromagnetic waves and the electromagnetic waves influence other parts of electronic devices, which may be a factor that causes malfunction of the electronic devices.

DISCLOSURE OF INVENTION

Technical Problem

Electronic devices of the related art block electromagnetic waves generated by electronic parts using a shield can made of a metal material and surrounding the electronic parts.

However, the shield can of the related art prevents the discharge of heat generated by electronic parts, so the electronic devices have a problem in that the heat generated by the electronic parts is not efficiently transferred or discharged.

Various embodiments of the disclosure provide an electronic device including a shielding structure that blocks electromagnetic waves from electronic parts and discharges heat from the electronic parts.

Solution to Problem

An electronic device according to various embodiments of the disclosure includes: a circuit board; an inelastic shield member having a recession and an opening formed in a portion of the recession, and disposed on one surface of the circuit board; a an electronic part located in the recession and disposed on the one surface in correspondence to the opening; a first heat transfer member disposed in contact with an outer surface of the process in at least a portion of a region of the opening; an elastic shield member disposed around the opening; and a second heat transfer member disposed in contact with the first heat transfer member and the elastic shield member, in which the second heat transfer member may include a metal plate and a heat transfer material having thermal conductivity higher than 1 W/mK and the heat transfer material may be coupled to the metal plate.

An electronic device according to various embodiments of the disclosure includes: a circuit board; an inelastic shield member having a recession and an opening formed in a portion of the recession, and disposed on one surface of the circuit board; a processor located in the recession and disposed on the one surface in correspondence to the opening; a first heat transfer member disposed in contact with an outer surface of the process in at least a portion of a region of the opening; an elastic shield member disposed around the opening; and a second heat transfer member disposed in contact with the first heat transfer member and the elastic shield member, in which the second heat transfer member may include a metal plate and a heat transfer material coated on the metal plate and may further include a heat dissipation member disposed on one surface of the heat transfer material.

A heat transfer member that is disposed around an electronic part according to various embodiments of the disclosure includes: a metal plate; and a heat transfer material coupled to the metal plate, in which one surface of the metal plate may have prominences and recessions, and a primer layer applied to the prominences and recessions and coupled to the heat transfer material, in which an area of the heat transfer material may be larger than an area of the metal plate, in which at least a portion of an edge region of the heat transfer material may protrude in a peripheral direction of the metal plate.

Advantageous Effects of Invention

Various embodiments of the disclosure can block electromagnetic waves of an electronic part and can quickly discharge heat of the electronic part.

MODE FOR THE INVENTION

Figure 1:
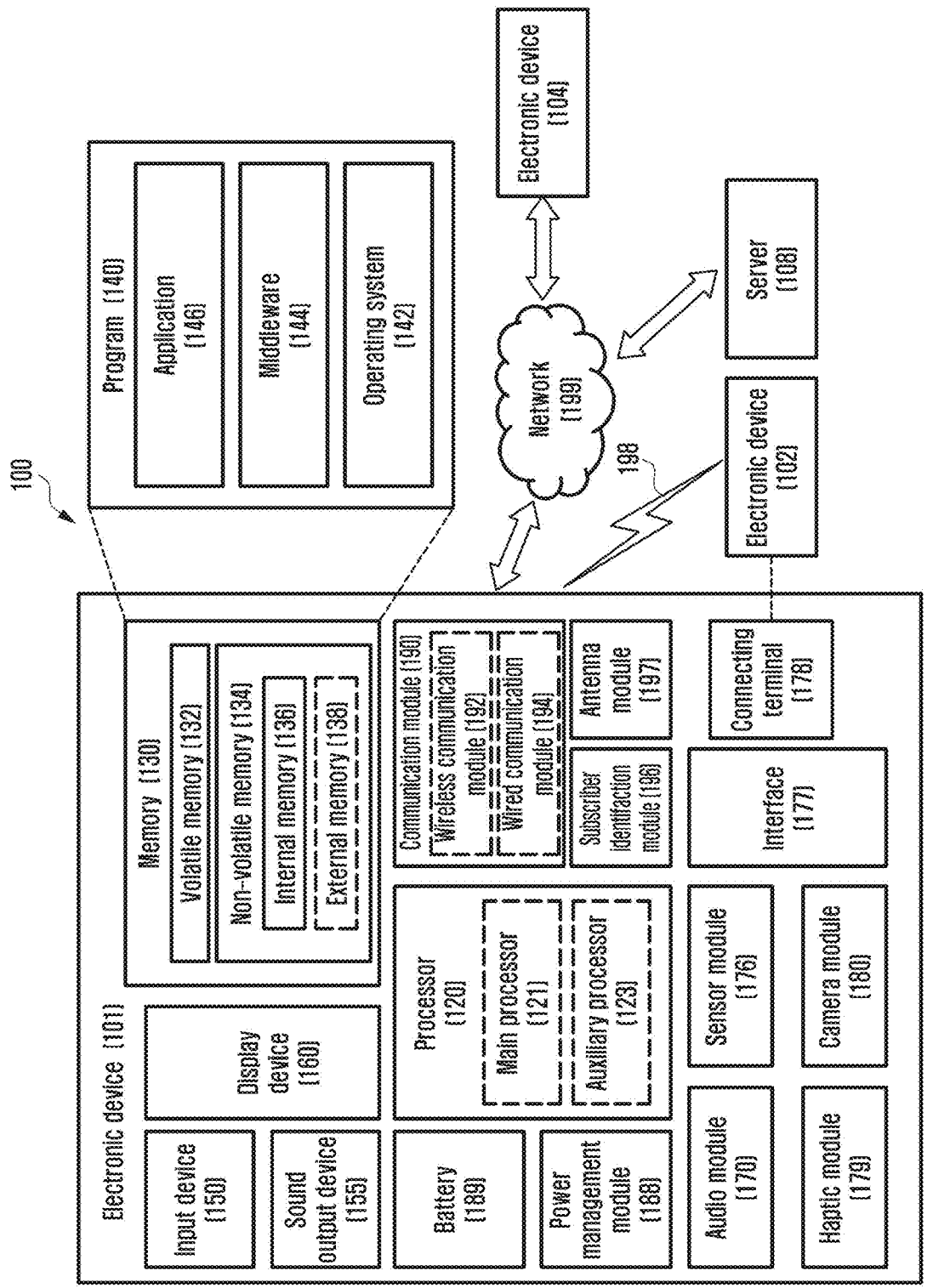
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
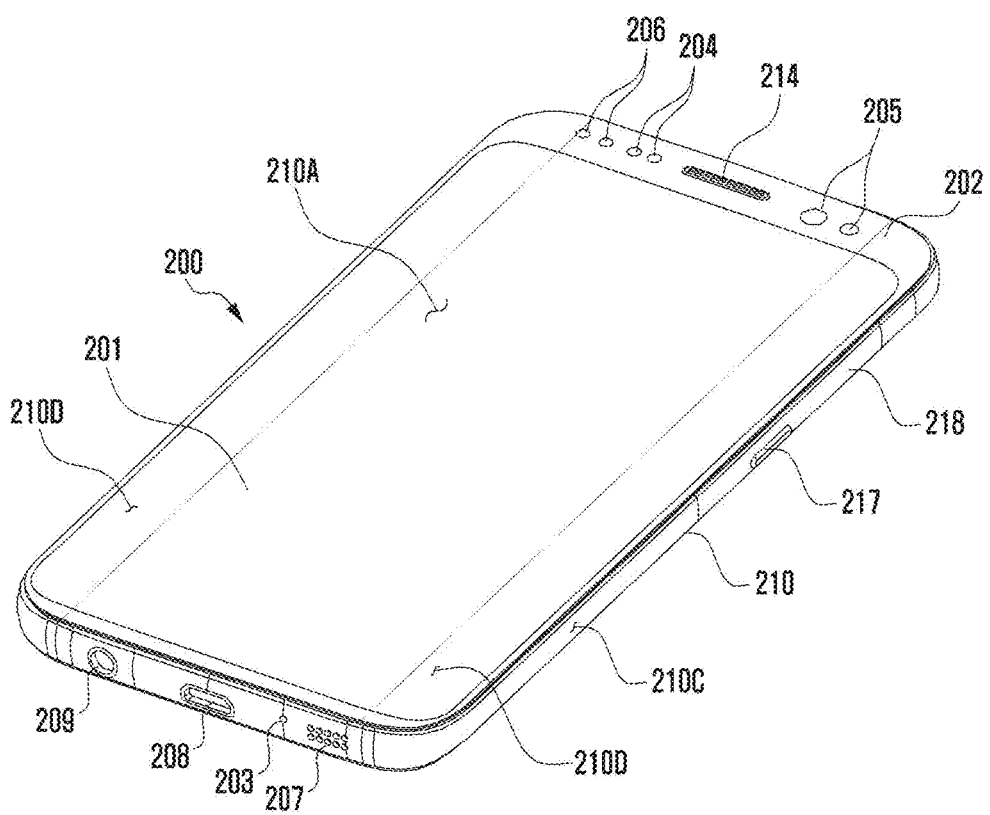
FIG. 2 is a front perspective view of a mobile electronic device according to an embodiment.
Figure 3:
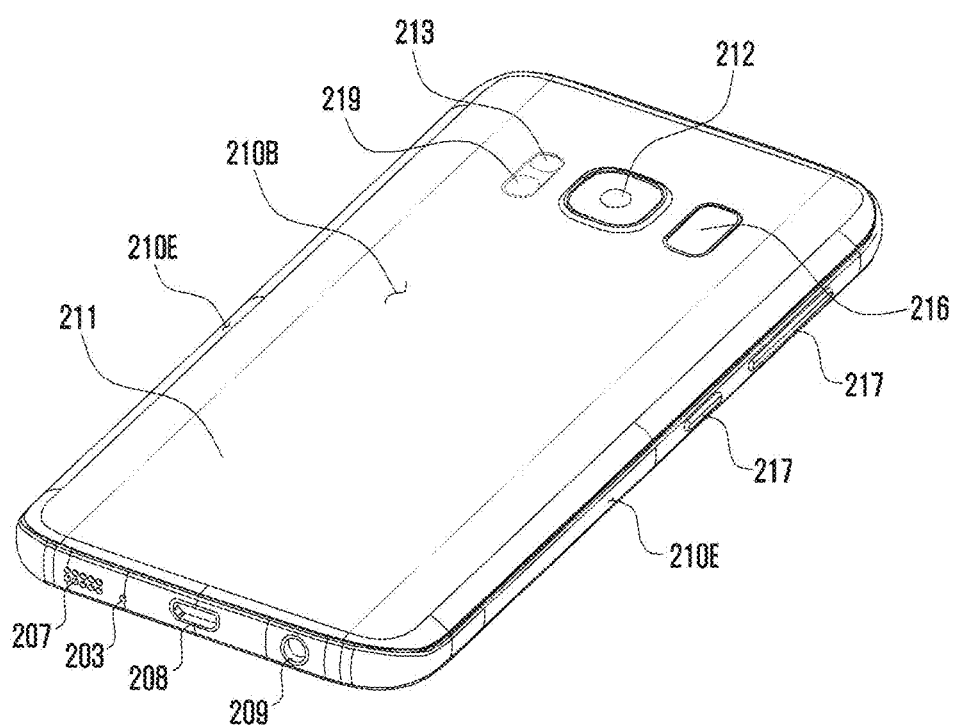
FIG. 3 is a rear perspective view of the electronic device of FIG. 2.
Figure 4:
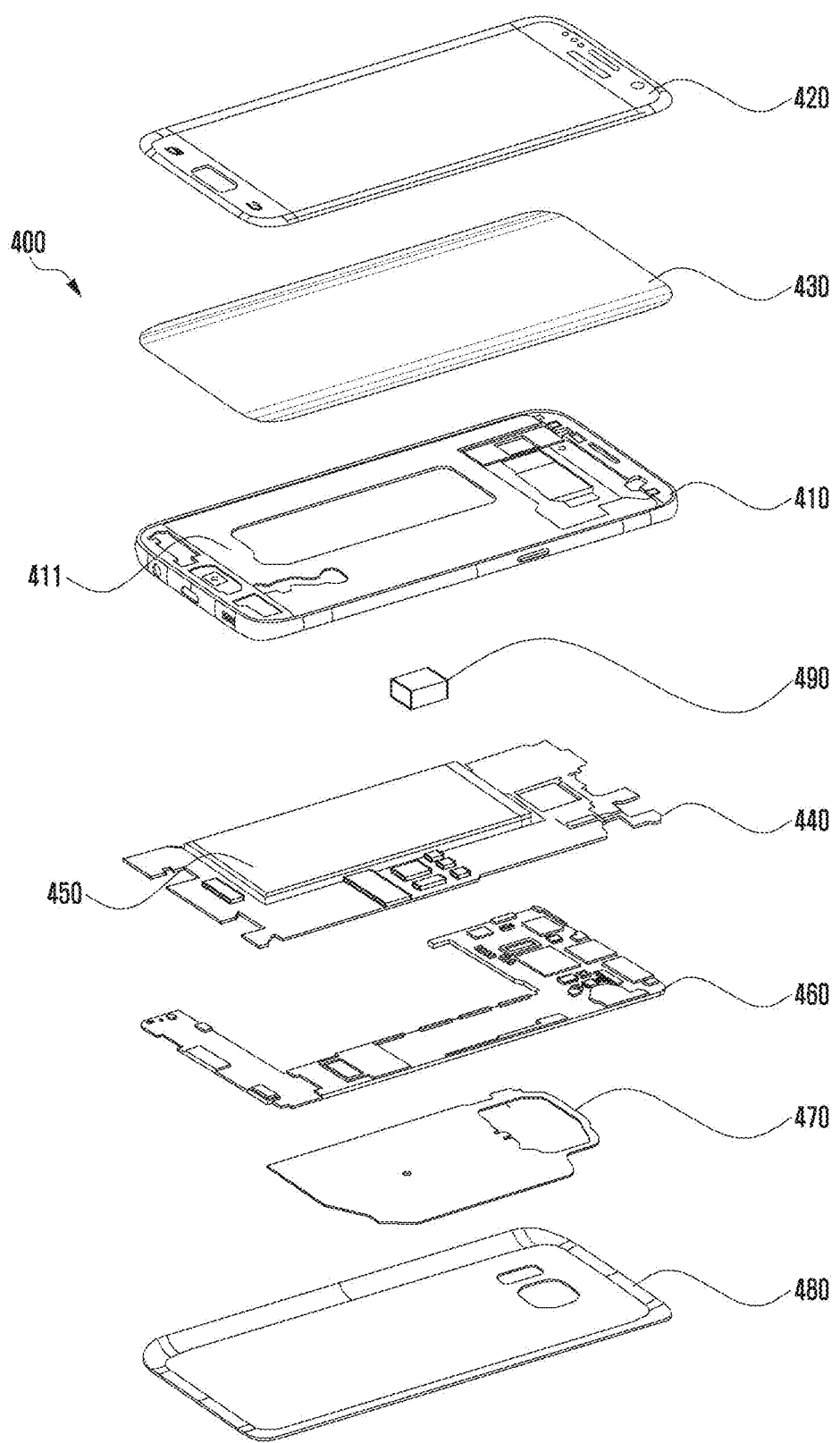
FIG. 4 is an exploded perspective view of the electronic device of FIG. 2.

FIG. 2 is a front perspective view of a mobile electronic device according to an embodiment. FIG. 3 is a rear perspective view of the electronic device of FIG. 2. FIG. 4 is an exploded perspective view of the electronic device of FIG. 2.

Referring to FIGS. 2 and 3, an electronic device 200 according to an embodiment may include a housing 210 having a first surface (or a front surface) 210A, a second surface (or a rear surface) 210B, and a side 210C surrounding the space between the first surface 210A and the second surface 210B. In another embodiment (not shown), the housing may mean a structure forming some of the first surface 210A, the second surface 210B, and the side 210C shown in FIG. 1. According to an embodiment, the first surface 210A may be at least partially substantially formed by a transparent front plate 202 (e.g., a glass plate or a polymer plate including various coating layers). The second surface 210B may be formed by a substantially opaque rear plate 211. The rear plate 211, for example, may be made of coated or colored glass, ceramic, a polymer, metal (e.g., aluminum, stainless steel (STS), or magnesium), or a combination of at least two of these materials. The side 210C is combined with a front plate 202 and a rear plate 211 and may be formed by a lateral bezel structure 218 (or a "lateral member") including metal and/or a polymer. In an embodiment, the rear plate 211 and the lateral bezel structure 218 may be integrated and may include the same material (e.g., a metallic material such as aluminum).

In the embodiment shown in the figures, the front plate 202 may have two first regions 210D, which bend toward the rear plate 211 from the first surface 210A and seamlessly extend, at both long edges of the front plate 202. In the shown embodiment (referring to FIG. 2), the rear plate 211 may have two second regions 210E, which bend toward the front plate 202 from the second surface 210B and seamlessly extend, at both long edges. In an embodiment, the front plate 202 (or the rear plate 211) may have only one of the first regions 210D (or the second regions 210E). In another embodiment, some of the first regions 210D or the second regions 210E may not be included. In the embodiments, when seen from a side of the electronic device 200, the side bezel structure 218 may have a first thickness (or width) at the sides not including the first regions 210D or the second regions 210E and may have a second thickness smaller than the first thickness at the sides including the first regions 210D or the second regions 210E.

According to an embodiment, the electronic device 200 may include at least one or more of a display 210, an audio module 203, 207, 214, a sensor module 204, 216, 219, a camera module 205, 212, 213, key input devices 217, a light emitting element 206, and connector holes 208 and 209. In an embodiment, the electronic device 200 may not include at least one (e.g., the key input devices 217) of the components, or the light emitting element 206, or may further include other components.

The display 201, for example, may be exposed through a large part of the front plate 202. In an embodiment, at least a portion of the display 201 may be exposed through the first surface 210A and the front plate 202 forming the first regions 210D of the side 210C. In an embodiment, the edge of the display 201 may be formed substantially in the same shape as the adjacent outline shape of the front plate 202. In another embodiment (not shown), in order to enlarge the exposed area of the display 201, the gap between the outline of the display 201 and the outline of the front plate 202 may be substantially uniform.

In another embodiment (not shown), a recess or an opening may be formed in a portion of a display area of the display 201, and at least one or more of the audio module 214, the sensor module 204, the camera module 205, and the light emitting element 206 aligned with the recess or the opening may be included. In another embodiment (not shown), at least one or more of the audio module 214, the sensor module 204, the camera module 205, the fingerprint sensor 216, and the light emitting element 206 may be disposed on the rear surface of the display region of the display 201. In another embodiment, the display 201 may be combined with or disposed adjacent to a touch sensing circuit, a pressure sensor that can measure the intensity (pressure) of a touch, and/or a digitizer that detects a magnetic stylus pen. In an embodiment, at least a portion of the sensor module 204, 219 and/or at least some of the key input devices 217 may be disposed in the first region 210D and/or the second region 210E.

The audio module 203, 207, 214 may include a microphone hole 203 and speaker holes 207 and 214. A microphone for catching external sounds may be disposed in the microphone hole 203, and in an embodiment, a plurality of microphones may be disposed therein to sense direction of sounds. The speaker holes 207 and 214 may include an external speaker hole 207 and a receiver hole 214 for a telephone call. In an embodiment, the speaker holes 207 and 214 and the microphone hole 203 may be integrated into one hole or a speaker (e.g., a piezo speaker) may be included without the speaker holes 207 and 214.

The sensor module 204, 216, 219 can generate an electrical signal or a data value corresponding to the internal operation state of the electronic device 200 or an external environmental state. The sensor module 204, 216, 219, for example, may include a first sensor module 204 (e.g., a proximity sensor) and/or a second sensor module (not shown) (e.g., a fingerprint sensor) disposed on the first surface 210A of the housing 210, and/or a third sensor module 219 (e.g., an HRM sensor) and/or a fourth sensor module 216 (e.g., a fingerprint sensor) disposed on the second surface 210B of the housing 210. The fingerprint sensor may be disposed not only on the first surface 210A (e.g., the display 201), but also the second surface 210B of the housing 210. The electronic device 200 may further include a sensor module (not shown), for example, at least one of a gesture sensor, a gyro sensor, a barometer sensor, a magnetic sensor, an acceleration sensor, a grip sensor, a color sensor, an Infrared (IR) sensor, a biosensor, a temperature sensor, a humidity sensor, or an illumination sensor 204.

The camera module 205, 212, 213 may include a first camera 205 disposed on the first surface 210A of the electronic device 200, and a second camera 212 and/or a flash 213 disposed on the second surface 210B. The camera modules 205 and 212 may include one or more lenses, an image sensor, and/or an image signal processor. A flash 213, for example, may include a light emitting diode or a xenon lamp. In an embodiment, two or more lenses (an infrared camera, a wide-angle lens, and a telephoto lens) and image sensors may be disposed on one surface of the electronic device 200.

The key input devices 217 may be disposed on the side 210C of the housing 210. In another embodiment, the electronic device 200 may not include some or all of the key input devices 217 described above and the non-included key input devices 217 may be implemented in other types such as software keys on the display 201. In an embodiment, the key input devices may include a sensor module 216 disposed on the second surface 210B of the housing 210.

The light emitting element 206, for example, may be disposed on the first surface 210A of the housing 210. The light emitting element 206, for example, may provide state information of the electronic device 200 in a light type. In another embodiment, the light emitting element 206, for example, may provide a light source that operates with the operation of the camera module 205. The light emitting element 206, for example, may include an LED, an IR LED, and a xenon lamp.

The connector holes 208 and 209 may include a first connector hole 208 that can locate a connector 208 (e.g., a USB connector) for transmitting and receiving power and/or data to and from external electronic devices and/or a second connector hole 209 (e.g., an earphone jack) that can locate a connector for transmitting and receiving audio signals to and from external electronic devices.

Referring to FIG. 4, an electronic device 400 may include a lateral bezel structure 410, a first supporting member 411 (e.g., a bracket), a front plate 420, a display 430, a printed circuit board 440, a battery 450, a second supporting member 460 (e.g., a rear case), an antenna 470, and a rear plate 480. In an embodiment, the electronic device 400 may not include at least one (e.g., the first supporting member 411 or the second supporting member 460) of the components, or may further include other components. At least one of the components of the electronic device 400 may be the same as or similar to at least one of the components of the electronic device 200 shown in FIG. 1 or FIG. 2, and repeated description is omitted below.

The first supporting member 411 is disposed in the electronic device 400 and may be connected with the lateral bezel structure 410 or may be integrated with the lateral bezel structure 410. The first supporting member 411, for example, may be made of a metallic material and/or a non-metallic material (e.g., a polymer). The display 430 may be coupled to a surface of the first supporting member 411 and the printed circuit board 440 may be coupled to the other surface of the first supporting member 411. A processor, a memory, and/or an interface may be mounted on the printed circuit board 440. The processor, for example, may include one or more of a CPU, an application processor, a graphic processor, an image signal processor, a sensor hub processor, or a communication processor.

The memory, for example, may include a volatile memory or a nonvolatile memory.

The interface may include a High Definition Multimedia Interface (HDMI), a Universal Serial Bus (USB) interface, an SD card interface, and/or an audio interface. The interface, for example, can electrically or physically connect the electronic device 400 to external electronic devices and may include a USB connector, an SD card/MMC connector, or an audio connector.

The battery 450, which is a device for supplying power to one or more components of the electronic device 400, for example, may include a primary battery that is not rechargeable, a secondary battery that is rechargeable, or a fuel cell. At least a portion of the battery 450, for example, may be disposed in substantially the same plane as the printed circuit board 440. The battery 450 may be integrally disposed in the electronic device 400 and may be detachably attached to the electronic device 400.

According to an embodiment, a shielding structure 490 may be disposed on one surface of the printed circuit board 440 to correspond to at least one electronic part mounted on the printed circuit board 440. For example, the shielding structure 490 may be disposed between the printed circuit board 440 and the first supporting member 411, one surface of the shielding structure 490 may be coupled to the metallic portion (not shown) of the first supporting member 411 or a heat dissipation member (e.g., a heat pipe or a vapor chamber), and another surface of the shielding structure 490 may be coupled to the printed circuit board 490 while covering at least one electronic part. According to an embodiment, the shielding structure 490 may be a component for preventing emission of electromagnetic waves generated by at least one electronic part and for quickly discharging heat generated by at least one electronic part to the outside. For example, the shielding structure 490 may include an inelastic shield member (e.g., a shield can) disposed to surround at least one electronic part, and at least one heat transfer member being in contact with the outer surface of the electronic part and arranged to overlap an opening of the inelastic shield member. According to an embodiment, at least one electronic device mounted on the printed circuit board 440 may include a central processing unit, an application processor, a graphic processing unit, an image signal processor, a sensor hub processor, a communication processor, a Power Amp Module (PAM), a Power Management Integrated Circuit (PMIC), or a charging IC.

The antenna 470 may be disposed between the rear plate 480 and the battery 450. The antenna 470, for example, may include a Near Field Communication (NFC) antenna, a wireless charging antenna, and/or a Magnetic Secure Transmission (MST) antenna. The antenna 470, for example, can perform near field communication with external devices or can wirelessly transmit and receive power for charging. In another embodiment, an antenna structure may be formed by a portion or a combination of the lateral bezel structure 410 and/or the first supporting member 411.

An electronic device (e.g., 600 in FIG. 6) according to various embodiments of the disclosure may include a circuit board (e.g., 610 in FIG. 6), an inelastic shield member having a recession and an opening formed in a portion of the recession and disposed on one surface of the circuit board 610, a processor located in the recession and disposed on the one surface in correspondence to the opening, a first heat transfer member (e.g., 630 in FIG. 6) disposed in contact with the outer surface of the process in at least a portion of the region of the opening, an elastic shield member disposed around the opening, and a second heat transfer member (e.g. 640 in FIG. 6) disposed in contact with the first heat transfer member 630 and the elastic shield member, in which the second heat transfer member 630 includes a metal plate (e.g., 641 in FIG. 6) and a heat transfer material (e.g., 643 in FIG. 6) having thermal conductivity higher than about 1 W/mK and the heat transfer material 643 may be coupled to the metal plate 641. The electronic device 600 may further include a heat dissipation member (e.g., 650 in FIG. 6) disposed on the second heat transfer member 640. The metal plate 641 may include a magnetic metal layer and a plated layer coupled to one surface of the magnetic metal layer. The magnetic metal layer may include SUS430 and the plated layer may include nickel (Ni). One surface facing the heat dissipation member 650 of the heat transfer material 643 may have average roughness (RMS value) of 10 um~100 um. The area of the heat transfer material 643 may be larger than the area of the metal plate 641. At least a portion of the edge region of the heat transfer material 643 may protrude toward the periphery of the metal plate 641. The area of the heat dissipation member 650 may be larger than the area of the heat transfer member. The heat transfer material 643 may include a material in which heat dissipation particles are mixed in synthetic resin. The heat dissipation particles may include alumina particles. The synthetic resin may include any one of silicon resin or acryl resin.

An electronic device (e.g., 600 in FIG. 6) according to various embodiments of the disclosure may include a circuit board (e.g., 610 in FIG. 6), an inelastic shield member having a recession and an opening formed in a portion of the recession and disposed on one surface of the circuit board 610, an electronic part (e.g. 620 in FIG. 6) located in the recession and disposed on the one surface in correspondence to the opening, a first heat transfer member (e.g., 630 in FIG. 6) disposed in contact with the outer surface of the process in at least a portion of the region of the opening, an elastic shield member disposed around the opening, and a second heat transfer member (e.g. 640 in FIG. 6) disposed in contact with the first heat transfer member 630 and the elastic shield member, in which the second heat transfer member 630 includes a metal plate (e.g., 641 in FIG. 6) and a heat transfer material (e.g., 643 in FIG. 6) coated on the metal plate 641, and may further include a heat dissipation member (650 in FIG. 6) disposed on one surface of the heat transfer material 643. The electronic part 620 may include at least one of a central processing unit, an application process, a graphic processing unit, an image signal processor, a sensor hub processor, a communication processor, a Power Amp Module (PAM), a Power Management Integrated Circuit (PMIC), or a charging. The metal plate 641 may include a magnetic metal layer and a plated layer coupled to one surface of the magnetic metal layer. The magnetic metal layer may include SUS430 and the plated layer may include nickel (Ni). One surface of the heat transfer material 643 may have average roughness (RMS value) of 10 um~100 um. The area of the heat transfer material 643 may be larger than the area of the metal plate 641. At least a portion of the edge region of the heat transfer material 643 may protrude toward the periphery of the metal plate 641. The area of the heat dissipation member 650 may be larger than the area of the heat transfer member.

A heat transfer member (e.g., 640 in FIG. 6) disposed around an electronic part (e.g., 620 in FIG. 6) according to various embodiments of the disclosure may include a metal plate (e.g., 641 in FIG. 6) and a heat transfer material (e.g., 643 in FIG. 6) coupled to the metal plate 641, one surface of the metal plate 641 may include prominences and recessions, and a primer layer applied to the prominences and recession and coupled to the heat transfer material 643, the area of the heat transfer material 643 may be larger than the area of the metal plate 641, and at least a portion of the edge region of the heat transfer material 643 may protrude toward the periphery of the metal plate 641.

Figure 5:
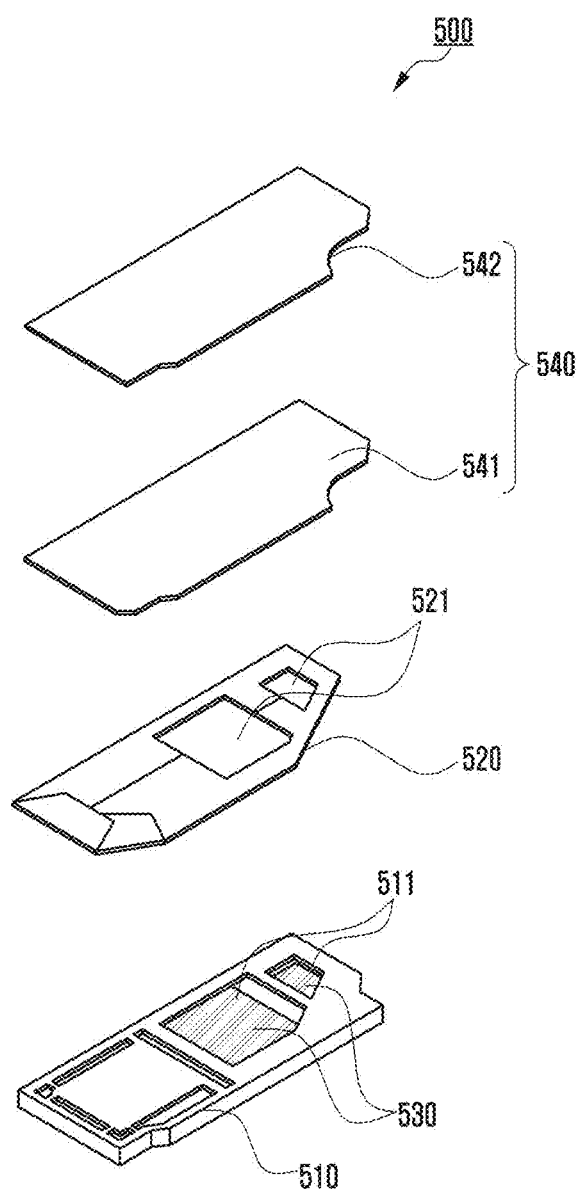
FIG. 5 is an exploded perspective view showing the configuration of a shielding structure according to various embodiments.

FIG. 5 is an exploded perspective view showing the configuration of a shielding structure according to various embodiments.

Referring to FIG. 5, a shielding structure 500 (e.g., the shielding structure 490 in FIG. 4) according to various embodiments of the disclosure may include a first shield member 510, a second shield member 520, a first heat transfer member 530, or a second heat transfer member 540.

According to an embodiment, the first shield member 510 may be a shield can having a recession (not shown, see the recession 713 in FIG. 7) forming a space and an opening 511 formed in a portion of the recession, as an inelastic shield member. For example, the first shield member 510 may be disposed on one surface of a printed circuit board (e.g., the printed circuit board 440 in FIG. 4) and may cover an electronic part (e.g., the processor 120 in FIG. 1) mounted on the printed circuit board 440. According to an embodiment, an electronic part may be located in the space of the first shield member 510 and the electronic part may be arranged to overlap the opening 511. For example, the opening 511 of the first shield member 510 may be formed to expose the electronic part located in the recession (space).

According to an embodiment, the second shield member 520 may be an elastic shield member disposed around the opening 511 of the first shield member 510. According to an embodiment, the second shield member 520 may be disposed around the opening 511 of the first shield member 510 and may be configured to have elasticity. According to an embodiment, the second shield member 520 may have a second opening 521 corresponding to the opening 511 of the first shield member 510 and may be disposed in contact with at least a portion of the first shield member 510.

According to an embodiment, the first heat transfer member 530 may be disposed in at least a portion of the region of the opening 511 of the first shield member 510 and may be in contact with the outer surface of an electronic part. According to an embodiment, the first heat transfer member 530 may be a component that vertically transmits heat generated by the electronic part. For example, the first heat transfer member 530 can transmit heat generated by the electronic part toward the opening 511 of the first shield member 510.

According to an embodiment, the second heat transfer member 540 may be disposed in contact with the first heat transfer member 530 and the second shield member 520. According to an embodiment, the second heat transfer member 540 may include a metal plate 541 and a heat transfer material (TIM: thermal interface material) 542 coupled on the metal plate 541. For example, the heat transfer material 542 may be coated on one surface of the metal plate 541. According to an embodiment, the second heat transfer member 540 may be a component that vertically transmits heat transmitted from the first heat transfer member 530. For example, when heat generated by the electronic part transfers through the first heat transfer member 530, the heat transfer material 542 of the second heat transfer member 540 can transmit the transferring heat to a heat dissipation member (e.g., a heat pipe or a vapor chamber) disposed on the shielding structure 500 or a component (e.g., the metallic portion of the first supporting member 411 in FIG. 4). According to an embodiment, the metal plate 541 of the second heat transfer member 540 may have a shield function that blocks electromagnetic waves that are generated by the electronic part and discharged through the opening 511 of the first shield member 510.

Figure 6:
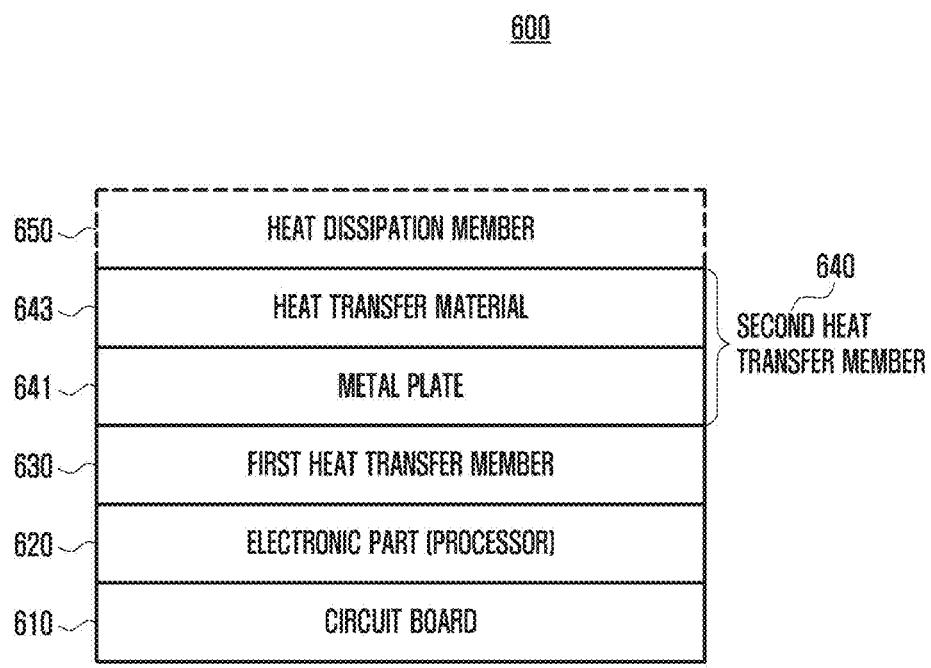
FIG. 6 is a configuration cross-sectional view schematically showing a portion of an electronic device assembled with a shielding structure according to various embodiments of the disclosure.

FIG. 6 is a configuration cross-sectional view schematically showing a portion of an electronic device assembled with a shielding structure according to various embodiments of the disclosure. For example, FIG. 6 may be an exemplary view schematically showing the combined state of an electronic device vertically arranged with reference to an electronic part mounted on a circuit board 610.

Referring to FIG. 6, an electronic device 600 according to various embodiments of the disclosure (e.g., the electronic device 400 in FIG. 4) includes a circuit board 610 (e.g., the printed circuit board 440 in FIG. 4), and for example, a process (e.g., the processor 120 in FIG. 1) may be mounted, as an electronic device 620, on the circuit board 610. According to an embodiment, a first heat transfer member 630 (e.g., the first heat transfer member 530 in FIG. 5) may be disposed on one surface of the electronic part 620, and a second heat transfer member 640 (e.g., the second heat transfer member 540 in FIG. 5) may be disposed on one surface of the first heat transfer member 630. According to an embodiment, the second heat transfer member 640 may include a metal plate 641 (e.g., the metal plate 541 in FIG. 5) being in contact with one surface of the first heat transfer member 630, and a heat transfer material 643 (e.g., the heat transfer material 542 in FIG. 5) disposed on one surface of the metal plate 641.

According to an embodiment, the first heat transfer member 630 may be a component that vertically transmits heat generated by the electronic part 620. For example, the first heat transfer member 630 can transmit heat generated by the electronic part 620 toward the second heat transfer member 640.

According to an embodiment, the second heat transfer member 640 may have a function that vertically transmits heat transmitted from the first heat transfer member 630. For example, when the heat transfer material 643 of the second heat transfer member 640 can transmit heat transmitted from the first heat transfer member 630 to a heat dissipation member 650 (e.g., a heat pipe or a vapor chamber) disposed on the second heat transfer material 640 or a component (e.g., the metallic portion of the first supporting member 411 in FIG. 4).

According to an embodiment, the second heat transfer member 640 may have a function that blocks electromagnetic waves that are generated by the electronic part 620 and discharged in a perpendicular direction of the electronic part 620. For example, the metal plate 641 of the second heat transfer member 640 can block electromagnetic waves that are generated by the electronic part 620 and vertically discharged.

Figure 7:
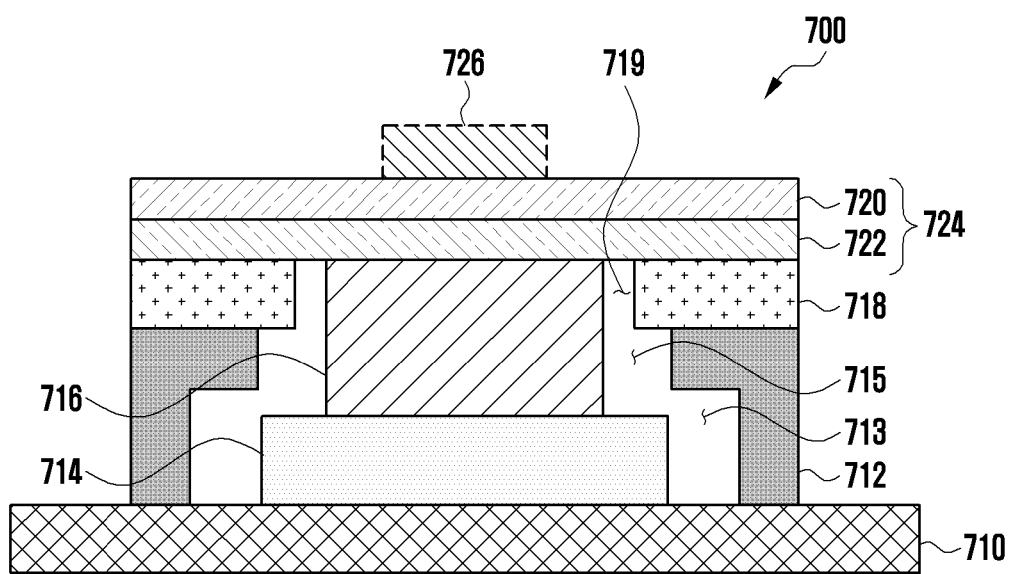
FIG. 7 is a cross-sectional view showing a portion of an electronic device assembled with a shielding structure according to various embodiments of the disclosure.

FIG. 7 is a cross-sectional view showing a portion of an electronic device assembled with a shielding structure according to various embodiments of the disclosure.

Referring to FIG. 7, an electronic device 700 (e.g., the electronic device 400 in FIG. 4) according to various embodiments of the disclosure may include a circuit board 710 (e.g., the printed circuit board 440 in FIG. 4), an electronic part 714 (e.g., the processor 120 in FIG. 1) mounted on the circuit board 710, and a shielding structure (e.g., the shielding structure 490 in FIG. 4) for blocking electromagnetic waves of the electronic part 714 and quickly discharging heat of the electronic part 714. According to an embodiment, the shielding structure (i.e., shield frame member) may include a first shield member 712 (e.g., the first shield member 510 in FIG. 5), a second shield member 718 (e.g., the second shield member 520 in FIG. 5), a first heat transfer member 716 (e.g., the first heat transfer member 530 in FIG. 5), or a second heat transfer member 724 (e.g., the second heat transfer member 540 in FIG. 5).

According to an embodiment, the first shield member 712 may be a shield can having a recession 713 forming a space and an opening 715 (e.g., the opening 511 in FIG. 5) formed in a portion of the recession 713, as an inelastic shield member. For example, the first shield member 712 may be disposed on one surface of the circuit board 710 (e.g., the printed circuit board 440 in FIG. 4) and may cover the electronic part 714 (e.g., the processor 120 in FIG. 1) mounted on the circuit board 710. For example, the first shield member 712 is disposed around the electronic part 714 and may have at least one opening 715 at a portion facing the electronic part 714. According to an embodiment, the first shield member 712 may be soldered and fixed to the circuit board 710. According to an embodiment, the electronic part 714 may be located in the space of the first shield member 712 and the electronic part 714 may be arranged to overlap the opening 715. For example, the opening 715 of the first shield member 712 may be formed to expose the electronic part 714 located in the recession 713.

According to an embodiment, the second shield member 718 may include an elastic shield member disposed around the opening 715 of the first shield member 712. According to an embodiment, the second shield member 718 may be disposed around the opening 715 of the first shield member 712 and may be configured to have elasticity. According to an embodiment, the second shield member 718 may have a second opening 719 (e.g., the second opening 521 in FIG. 5) corresponding to the opening 715 of the first shield member 712 and may be disposed in contact with at least a portion of the first shield member 712. For example, the second shield member 718 may have at least one second opening 719 to discharge heat that is conducted through the first heat transfer member 716. According to an embodiment, the second shield member 718 can cover at least a portion of the first shield member 712 to block electromagnetic waves of the electronic part 714. For example, the second shield member 718 may be electrically connected with the first shield member 712 in contact with at least a portion of the first shield member 712. According to an embodiment, the second shield member 718 may include an elastic layer (not shown) made of an elastic material and a shield layer (not shown) coupled to the outer side of the elastic layer (i.e., shield cover film). According to an embodiment, the elastic layer of the second shield member 718 may include a material having an elastic material, and for example, may include polyurethane (PU) foam. According to an embodiment, the second shield member 718 is configured to surround the outside of the elastic layer and may include a shield film in which a plurality of nanofibers plated with copper (Cu) or nickel (Ni) are stacked.

According to an embodiment, the first heat transfer member 716 may be disposed in at least a portion of the region of the opening 715 of the first shield member 712 and may be in contact with the outer surface of the electronic part 714. According to an embodiment, the first heat transfer member 716 may be a component that vertically transmits heat generated by the electronic part 714. For example, the first heat transfer member 716 can transmit heat generated by the electronic part 714 toward the opening 715 of the first shield member 712. For example, the first heat transfer member 716 can transmit heat generated by the electronic part 714 to the second heat transfer member 724 through the opening 715 and the second opening 719. According to an embodiment, the first heat transfer member 716 may include a carbon fiber and a material in which heat dissipation particles are mixed win synthetic resin. According to an embodiment, the heat dissipation particles may include alumina particles. According to an embodiment, the synthetic resin of the first heat transfer member 716 may include silicon-based synthetic resin. According to an embodiment, the carbon fiber of the first heat transfer member 716 (i.e., a first thermal interface material) may be arranged perpendicular to the electronic part 714. According to an embodiment, since the carbon fiber is arranged perpendicular to the electronic part 714, heat generated by the electronic part 714 can be easily vertically transmitted.

According to an embodiment, the second heat transfer member 724 may be disposed in contact with the first heat transfer member 716 and the second shield member 718. According to an embodiment, the second heat transfer member 724 may include a metal plate 722 and a heat transfer material (TIM: thermal interface material) 720 coupled (e.g., coated) on the metal plate 722. According to an embodiment, the heat transfer material 720 may have thermal conductivity higher than an insulating film. For example, the heat transfer material 720 may have thermal conductivity higher than about 1 W/mK. Accordingly, the second heat transfer member 724 of the disclosure can have higher heat transfer efficiency than a heat transfer member including an insulating film. According to an embodiment, the second heat transfer member 724 may be a component that vertically transmits heat transmitted from the first heat transfer member 716. For example, when heat generated by the electronic part 714 transfers through the first heat transfer member 716, the heat transfer material 720 of the second heat transfer member 724 can transmit the transferring heat to a heat dissipation member 726 (e.g., a heat pipe or a vapor chamber) disposed on the shielding structure or a component (e.g., the metallic portion of the first supporting member 411 in FIG. 4). According to an embodiment, the metal plate 722 of the second heat transfer member 724 may have a shield function that blocks electromagnetic waves that are generated by the electronic part 714 and discharged through the opening 715 of the first shield member 712. According to an embodiment, the heat transfer material 720 of the second heat transfer member 724 may have high thermal conductivity because thermal contact resistance to the metal plate 722 is low. For example, the surface of the metal plate 722 has fine prominences and recessions, so when a general insulating film is attached to a surface of the metal plate 722, air gaps may be generated on the coupling surface between the insulating film and the metal plate due to the prominences and recession. The air gap may cause deterioration of thermal conductivity by increasing thermal contact resistance between the insulating film and the metal plate 722. However, according to an embodiment of the disclosure, the heat transfer material 720 is coupled to the metal plate 722 by applying and then hardening a liquid composite on the surface of the metal plate 722, so the air gaps between the prominences and recessions formed on the surface of the metal plate 722 can be filled with the heat transfer material 720. Accordingly, the air gaps between the heat transfer material 720 and the metal plate 722 are removed, so the second heat transfer member 724 can have lowered thermal contact resistance and high thermal conductivity.

According to an embodiment, the heat transfer material 720 of the second heat transfer member 724 may include a material in which and heat dissipation particles are mixed win synthetic resin. For example, the heat dissipation particles of the heat transfer material 720 may include alumina particles. According to an embodiment, the synthetic resin of the heat transfer material 720 may include a material such as silicon resin or acryl resin.

According to an embodiment, the heat dissipation member 726 may be disposed on one surface of the second heat transfer member 724. For example, the heat dissipation member 726 may be a heat pipe being in contact with a component (e.g., the first supporting member 411 in FIG. 4) disposed on the shielding structure.

Figure 8:
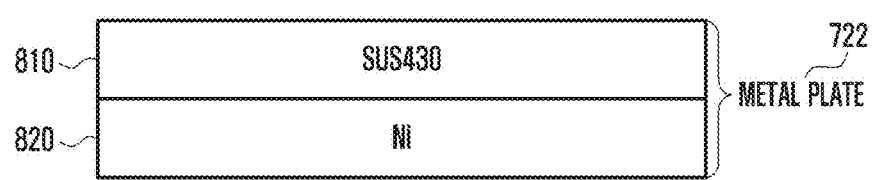
FIG. 8 is a configuration cross-sectional view schematically showing a metal plate of a second heat transfer member according to various embodiments of the disclosure.
Figure 9:
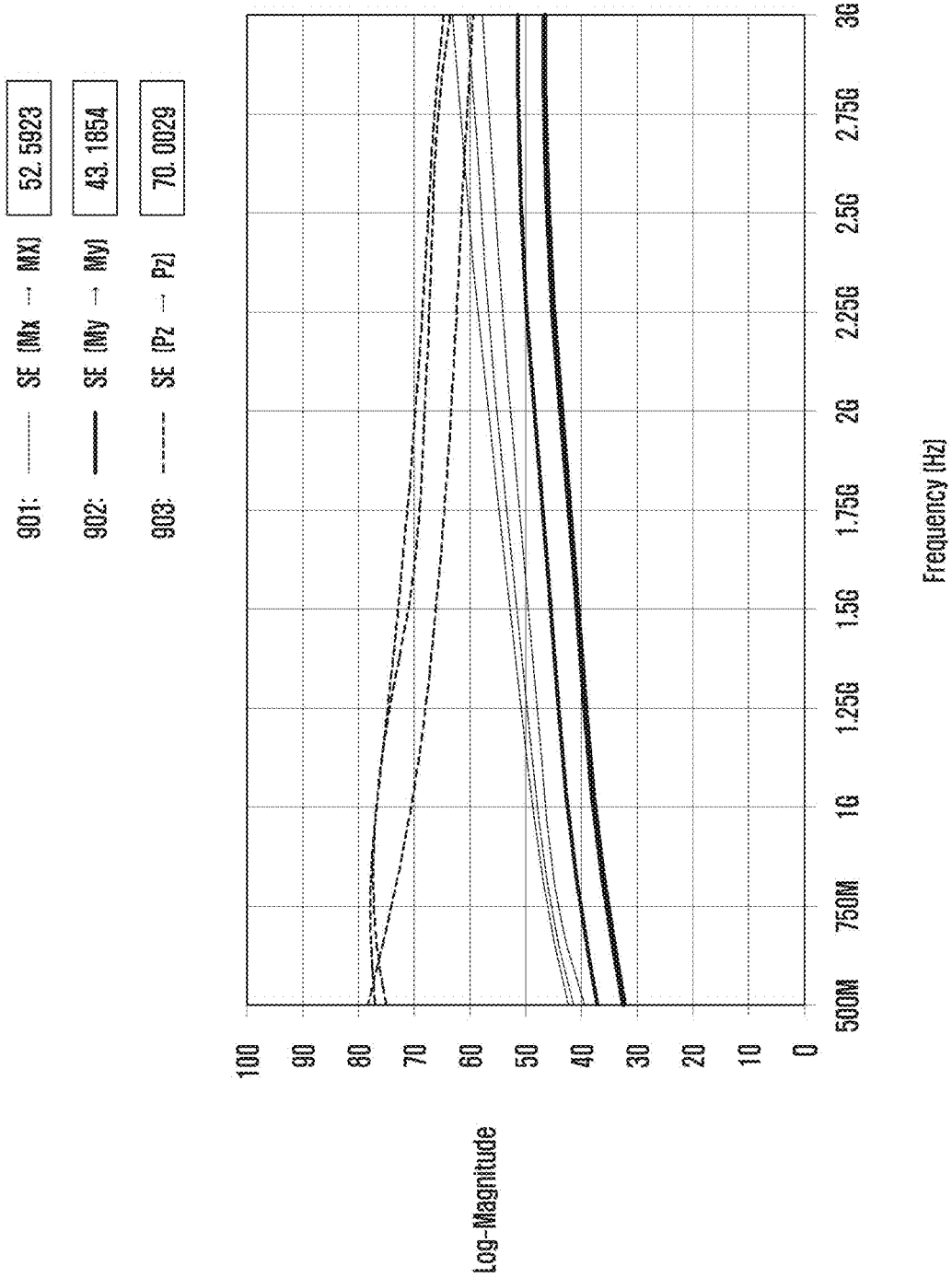
FIG. 9 is the result of testing the shielding performance of the metal plate of the second heat transfer member according to various embodiments of the disclosure.

FIG. 8 is a configuration cross-sectional view schematically showing a metal plate of a second heat transfer member according to various embodiments of the disclosure. FIG. 9 is the result of testing the shielding performance of the metal plate of the second heat transfer member according to various embodiments of the disclosure.

Referring to FIG. 8, the metal plate 722 of a second heat transfer material (e.g., the heat transfer material 724 in FIG. 7) according to various embodiments of the disclosure may include a magnetic metal layer 810 and a plated layer 820 coupled (coated) on one surface of the magnetic metal layer 810 to increase the blocking performance. According to an embodiment, the magnetic metal layer 810 may include Steel Used Stainless (SUS) 430 and the plated layer 820 may include nickel (Ni). According to an embodiment of the disclosure, since the metal plate 722 includes of SUS430, it is possible to block noise (e.g., electromagnetic waves) in a predetermined frequency band (e.g., a low frequency band) generated by the electronic part 714. According to an embodiment of the disclosure, since nickel (Ni) is plated on the metal plate 722, it is possible to block noise (e.g., electromagnetic waves) in another predetermined frequency band (e.g., a high frequency band). For example, in the test result of FIG. 9, a curve 901, a curve 902, and a curve 903 respectively may mean the degrees (values) of the metal plate 722 blocking electromagnetic waves (noise) generated in x-, y-, and z-axial directions by the electronic part 714. For example, 52.5923, 43.1854, and 70.0029 that are test result values shown at the right upper portion in FIG. 9 may mean the ability to block electromagnetic wave noise. It can be seen that the curve 903 showing the blocking ability in the z-axial direction in FIG. 9 has a low slope at all frequency bands (a low frequency band and a high frequency band) and the value showing the result value is also high in comparison to the other curves 901 and 902. Accordingly, it can be seen that the metal plate 722 of the disclosure has high blocking performance to not only low-frequency noise, but also high-frequency noise of the electronic part 714 in the z-axial direction.

Figure 10:
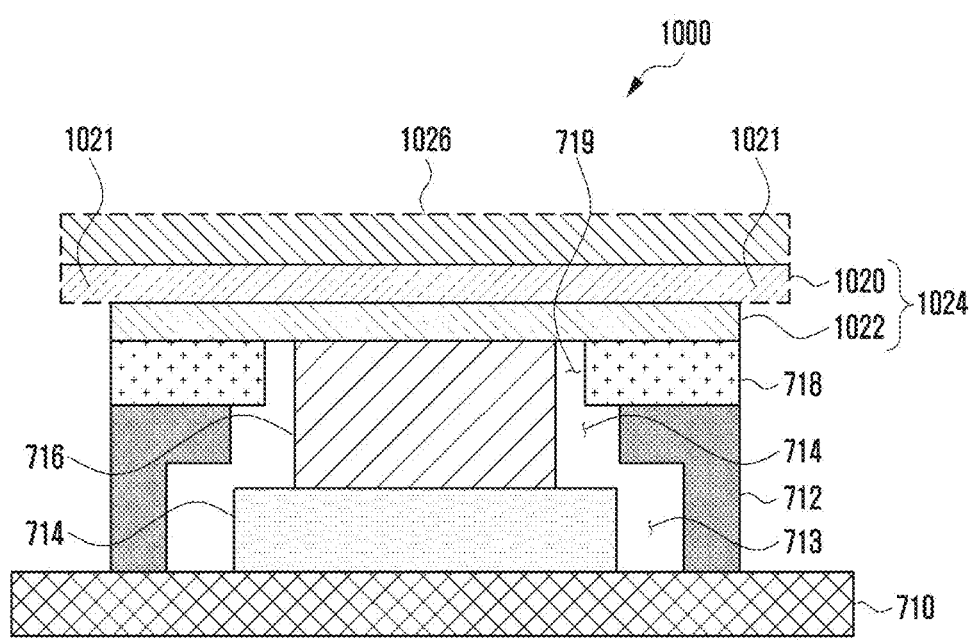
FIG. 10 is a cross-sectional view showing a portion of an electronic device assembled with a shielding structure according to another embodiment of the disclosure.

FIG. 10 is a cross-sectional view showing a portion of an electronic device assembled with a shielding structure according to another embodiment of the disclosure. For example, the electronic device shown in FIG. 10 may be partially changed from the electronic device shown in FIG. 7 in the structure of the metal plate and the structure of the heat dissipation member. In FIG. 10, the same components as those shown in FIG. 7 are given the same reference numerals as those of FIG. 7, and only different components in FIG. 10 are described.

Referring to FIG. 10, in an electronic device 1000 (e.g., the electronic device 400 in FIG. 4) according to another embodiment of the disclosure, the area of a heat transfer material 1020 (e.g., the heat transfer material 542) of a second heat transfer member 1024 (e.g., the second heat transfer member 540 in FIG. 5) may be larger than the area of a metal plate 1022 (e.g., the heat transfer material 541 in FIG. 5). For example, the heat transfer material 1020 has a first area and the metal plate 1022 may have a second area larger than the first area. According to an embodiment, the metal plate 1022 may have a small area in comparison to the heat transfer material 1020 by etching at least a portion of the edge region. For example, the heat transfer material 1020 may have a first portion coupled to the metal plate 1022 and a second portion not coupled to the metal plate 1022. The second part may be an edge region 1021 of the heat transfer material 1020 not coupled to the metal plate 1022. For example, in a cross-section of the second heat transfer member 1024, at least a portion of the edge region 1021 of the heat transfer material 1020 may protrude in a peripheral direction of the metal plate 1022. Alternatively, when seeing the second heat transfer member 1024 in a plane, the heat transfer material 1020 may have a first width and a first breadth and the metal plate 1022 may have a second width and a second breadth, in which the first width may be larger than the second width and the first breadth may be larger than the second breadth.

According to an embodiment of the disclosure, since the area of the heat transfer material 1020 is larger than the area of the metal plate 1022, it is possible to prevent problems related to an electric shock due to contact of at least a portion of the metal plate 1022 with other surrounding components. For example, according to an embodiment of the disclosure, since at least a portion of the edge region of the heat transfer material 1020 protrudes in the peripheral direction of the metal plate 1022, it is possible to prevent the metal plate 1022 from coming in contact with other components horizontally disposed, thereby being able to prevent the problems related to an electric shock.

According to an embodiment, as shown in FIG. 10, the area of the heat dissipation member 1026 may be increased in an electronic device according to another embodiment of the disclosure. For example, the area of the heat dissipation member 1026 may be designed to be larger than the area of the heat transfer member 1024. According to an embodiment of the disclosure, since the area of the heat dissipation member 1026 is increased, the heat dissipation effect can be improved.

Figure 11:
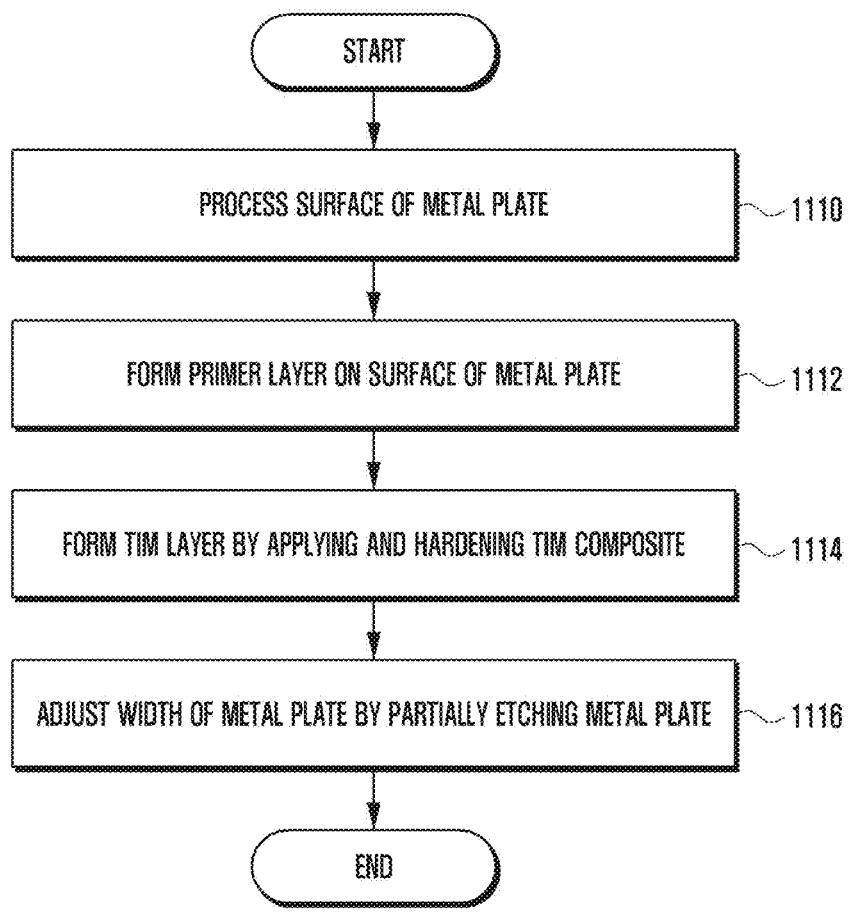
FIG. 11 is a flowchart showing a manufacturing process that combines a heat transfer material and a metal plate.
Figure 12A:
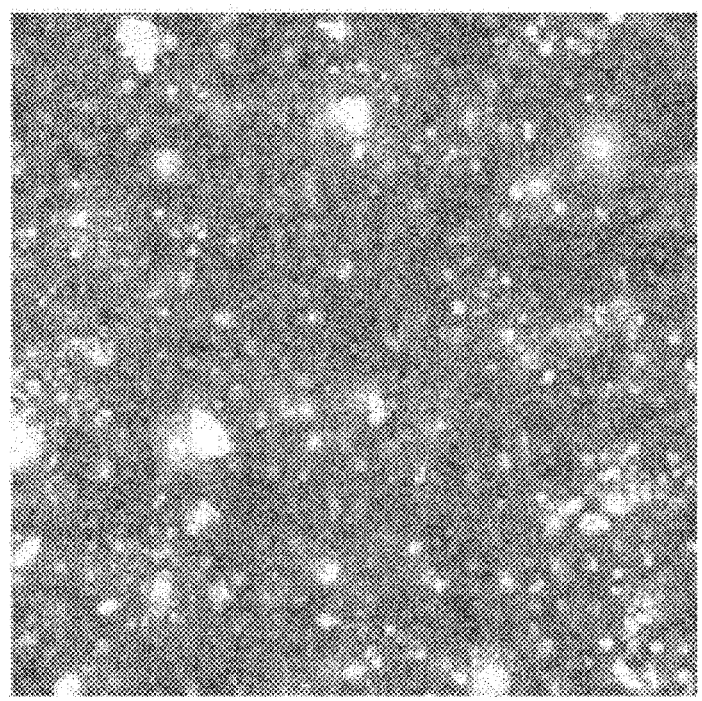
FIG. 12A and FIG. 12B are examples of photographing the surface of a heat transfer material having roughness.
Figure 12B:
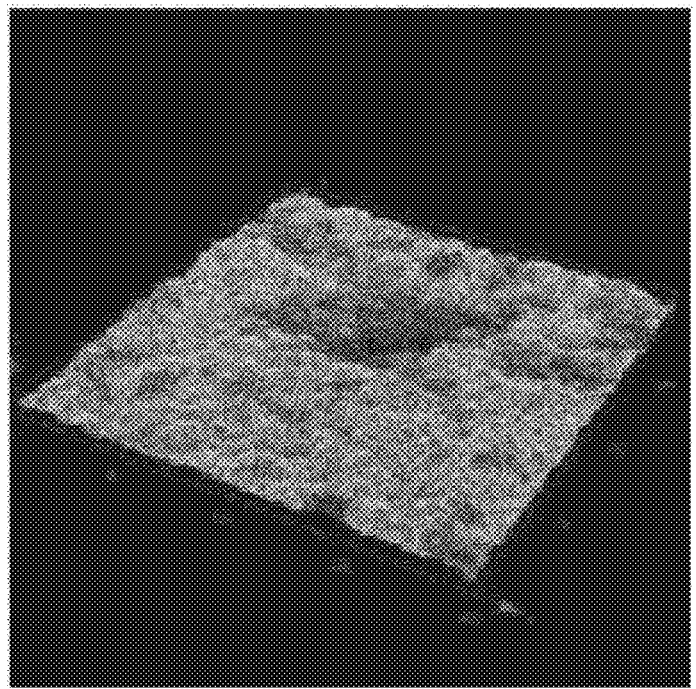

FIG. 11 is a flowchart showing a manufacturing process that combines a heat transfer substance and a metal plate. FIG. 12A and FIG. 12B are examples of photographing the surface of a heat transfer material having roughness. For example, FIG. 11 may be a flowchart showing a process of coating a heat transfer material on one surface of a metal plate.

Referring to FIG. 11, a manufacturing process of combining a heat transfer material (e.g., the heat transfer material 720 in FIG. 7) and a metal plate (e.g., the metal plate 722 in FIG. 7) according to an embodiment of the disclosure can prepare the metal plate 722 and perform surface processing on the surface of the prepared metal plate 722 in step 1110. For example, in step 1110, fine prominences and recession can be formed by etching a portion of the surface of the metal plate 722 using a plasma process.

In step 1112, the manufacturing process of combining the heat transfer material 720 and the metal plate 722 may include a process of forming a primer layer by applying a primer composite to the surface of the metal plate 722 having fine prominences and recessions. According to an embodiment, the primer composite may include organic acid metal salt or metal, or a polymeric resin, in which the polymeric resin may be one or more selected from polyurethane resin, phenol resin, rosin resin, polyvinyl pyrrolidone resin, acrylate resin, epoxy resin, or cellulose resin, or a combination thereof.

In step 1114, the manufacturing process of combining the heat transfer material 720 and the metal plate 722 may include a process of coupling the heat transfer material 720 to the surface of the metal plate 722 by applying and hardening a composite of the heat transfer material 720 (TIM: thermal interface material) on the surface of the metal plate 722 having the primer layer. According to an embodiment, the air gaps between the fine prominences and recession formed on the surface of the metal plate 722 may be filled with the heat transfer material 720. Accordingly, the air gaps between the heat transfer material 720 and the metal plate 722 are removed, so thermal contact resistance decreases, and accordingly, the contact surface between the heat transfer material 720 and the metal plate 722 can have high thermal conductivity. According to an embodiment, in step 1130, one surface of the heat transfer material 720 may be given predetermined roughness while the composite of the heat transfer material 720 is hardened. For example, some (e.g., silicon) of the composite of the heat transfer material 720 are discharged through the surface of the heat transfer material 720 in a gas type in the hardening process, and the surface of the heat transfer material 720 may be hardened to have predetermined roughness in the discharging process. According to an embodiment, as shown in FIG. 12A and FIG. 12B, the one surface of the heat transfer material 720 is a surface facing the heat dissipation member (e.g., 726 in FIG. 7) and may have average roughness of a predetermined level. For example, the average roughness of a predetermined level may include a Root Mean Square (RMS) value of about 10 um~100 um. According to an embodiment of the disclosure, since one surface of the heat transfer material 720 has predetermined roughness, so the adhesive force may decrease and contamination of the heat transfer material 720 due to surrounding foreign substances can be prevented.

In step 1116, the manufacturing process of combining the heat transfer material 720 and the metal plate 722 may include a process of adjusting the width of the metal plate 722 by partially etching at least a portion of the edge region of the metal plate 722. For example, at least a portion of the edge region of the metal plate 722 can be etched so that the area of the metal plate 722 becomes smaller than the area of the heat transfer material 720. Accordingly, in a cross-section of the assembly of the heat transfer material 720 and the metal plate 722, at least a portion of the edge region of the heat transfer material 720 may protrude in the peripheral direction of the metal plate 722.

As described above, various embodiments of the disclosure can block electromagnetic waves of an electronic part and can quickly discharge heat of the electronic part.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a circuit board;
an electronic component disposed on the circuit board;
a shield frame member including side walls and a top wall having an opening, and disposed on the circuit board over the electronic component;
a first thermal interface material (TIM) disposed at least partly in contact with an outer surface of the electronic component in at least a portion of a region of the opening;
a shield cover film disposed to cover the opening of the top wall of the shield frame member such that at least a part of the first TIM is disposed between the electronic component and the shield cover film, the shield cover film comprising:
a metal layer, and
a second TIM coupled to the metal layer without a medium disposed in between that has a lower thermal conductivity than the second TIM; and
a heat dissipation member disposed in contact with the shield cover film and configured to receive at least a portion of heat generated by the electronic component,
wherein a first surface of the metal layer of the shield cover film is in contact with a surface of the second TIM of the shield cover film,
wherein a second surface of the metal layer of the shield cover film is in contact with the first TIM,
wherein an inner area of the second surface of the metal layer of the shield cover film is in direct contact with the first TIM,
wherein a fiber layer, comprising fibers plated with copper (Cu) or nickel (Ni), is disposed to overlap at least a portion of an outer area of the second surface of the metal layer of the shield cover film that encloses the inner area, and
wherein the fiber layer is in direct contact with the shield frame member.

2. The electronic device of claim 1,
wherein the side walls of the shield frame member are substantially perpendicular to the circuit board and the shield cover film is substantially parallel to the circuit board, and
wherein each of the side walls of the shield frame member is spaced apart from one corresponding side surface of the electronic component.

3. The electronic device of claim 1, wherein the first surface of the metal layer comprises at least one of fine prominences and recessions.

4. The electronic device of claim 1, wherein the shield frame member and the shield cover film collectively shield the electronic component to mitigate electromagnetic interference associated with the electronic component.

5. The electronic device of claim 1, wherein the shield frame member, the fiber layer, and the shield cover film collectively shield the electronic component to mitigate electromagnetic interference associated with the electronic component.

6. The electronic device of claim 1, wherein the surface of the second TIM of the shield cover film facing the heat dissipation member has an average roughness of a root mean square (RMS) value of 10 um~100 um.

7. The electronic device of claim 6, wherein the shield cover film is elastic.

8. The electronic device of claim 1, wherein the heat dissipation member comprises a vapor chamber or a heat pipe.

9. An electronic device comprising:
a circuit board;
an electronic component disposed on the circuit board;
a shield frame member including side walls and a top wall having an opening, and disposed on the circuit board over the electronic component;
a first thermal interface material (TIM) disposed at least partly in contact with an outer surface of the electronic component in at least a portion of a region of the opening;
a shield cover film disposed to cover the opening of the top wall of the shield frame member such that at least a part of the first TIM is disposed between the electronic component and the shield cover film, the shield cover film comprising:
a metal layer including a first surface that comprises at least one of fine prominences and recessions, and
a second TIM directly coupled to the first surface of the metal layer by hardening a liquid form of the second TIM applied to the first surface of the metal layer; and
a heat dissipation member disposed in contact with the shield cover film and configured to receive at least a portion of heat generated by the electronic component,
wherein a first surface of the metal layer of the shield cover film is in contact with a surface of the second TIM of the shield cover film, wherein a second surface of the metal layer of the shield cover film is in contact with the first TIM, wherein an inner area of the second surface of the metal layer of the shield cover film is in direct contact with the first TIM, wherein a fiber layer, comprising fibers plated with copper (Cu) or nickel (Ni), is disposed to overlap at least a portion of an outer area of the second surface of the metal layer of the shield cover film that encloses the inner area, and wherein the fiber layer is in direct contact with the shield frame member.

10. The electronic device of claim 9,
wherein the side walls of the shield frame member are substantially perpendicular to the circuit board and the shield cover film is substantially parallel to the circuit board, and
wherein each of the side walls of the shield frame member is spaced apart from one corresponding side surface of the electronic component.

11. The electronic device of claim 9, wherein the shield frame member and the shield cover film collectively shield the electronic component to mitigate electromagnetic interference associated with the electronic component.

12. The electronic device of claim 9, wherein the shield frame member, the fiber layer, and the shield cover film collectively shield the electronic component to mitigate electromagnetic interference associated with the electronic component.

13. The electronic device of claim 9, wherein the surface of the second TIM of the shield cover film facing the heat dissipation member has an average roughness of a root mean square (RMS) value of 10 um~100 um.

14. The electronic device of claim 13, wherein a medium having a lower thermal conductivity than the second TIM is not disposed between the outer surface of the metal layer and the second TIM.

15. The electronic device of claim 14, wherein the shield cover film is elastic.

16. The electronic device of claim 9, wherein the heat dissipation member comprises a vapor chamber or a heat pipe.

17. An electronic device comprising:
a circuit board;
an electronic component disposed on the circuit board;
a shield frame member including side walls and a top wall having an opening, and disposed on the circuit board over the electronic component;
a first thermal interface material (TIM) disposed at least partly in contact with an outer surface of the electronic component in at least a portion of a region of the opening;
a shield cover film disposed to cover the opening of the top wall of the shield frame member such that at least a part of the first TIM is disposed between the electronic component and the shield cover film, the shield cover film comprising:
a metal layer, and
a second TIM coupled to a first surface of the metal layer by hardening a liquid form of the second TIM applied to the first surface of the metal layer such that a medium having a lower thermal conductivity than the second TIM is not disposed between the first surface of the metal layer and the second TIM; and
a heat dissipation member disposed in contact with the shield cover film and configured to receive at least a portion of heat generated by the electronic component, wherein a first surface of the metal layer of the shield cover film is in contact with a surface of the second TIM of the shield cover film, wherein a second surface of the metal layer of the shield cover film is in contact with the first TIM, wherein an inner area of the second surface of the metal layer of the shield cover film is in direct contact with the first TIM, wherein a fiber layer, comprising fibers plated with copper (Cu) or nickel (Ni), is disposed to overlap at least a portion of an outer area of the second surface of the metal layer of the shield cover film that encloses the inner area, and wherein the fiber layer is in direct contact with the shield frame member.

18. The electronic device of claim 17,
wherein the side walls of the shield frame member are substantially perpendicular to the circuit board and the shield cover film is substantially parallel to the circuit board, and
wherein each of the side walls of the shield frame member is spaced apart from one corresponding side surface of the electronic component.

19. The electronic device of claim 17, wherein the shield frame member and the shield cover film collectively shield the electronic component to mitigate electromagnetic interference associated with the electronic component.

20. The electronic device of claim 17, wherein the shield frame member, the fiber layer, and the shield cover film collectively shield the electronic component to mitigate electromagnetic interference associated with the electronic component.

21. The electronic device of claim 17, wherein the surface of the second TIM of the shield cover film facing the heat dissipation member has an average roughness of a root mean square (RMS) value of 10 um~100 um.

22. An electronic device comprising:
a circuit board;
an electronic component disposed on the circuit board;
a shield frame member including side walls and a top wall having an opening, and disposed on the circuit board over the electronic component;
a first thermal interface material (TIM) disposed at least partly in contact with an outer surface of the electronic component in at least a portion of a region of the opening;
a shield cover film disposed to cover the opening of the top wall of the shield frame member such that at least a part of the first TIM is disposed between the electronic component and the shield cover film, the shield cover film comprising:
a metal layer, and
a second TIM directly formed on an outer surface of the metal layer by applying a liquid form of the second TIM on the metal layer and hardening the liquid form of the second TIM on the metal layer such that a medium having a lower thermal conductivity than the second TIM is not disposed between the outer surface of the metal layer and the second TIM; and
a heat dissipation member disposed in contact with the shield cover film and configured to receive at least a portion of heat generated by the electronic component,
wherein a first surface of the metal layer of the shield cover film is in contact with a surface of the second TIM of the shield cover film,
wherein a second surface of the metal layer of the shield cover film is in contact with the first TIM, wherein an inner area of the second surface of the metal layer of the shield cover film is in direct contact with the first TIM, wherein a fiber layer, comprising fibers plated with copper (Cu) or nickel (Ni), is disposed to overlap at least a portion of an outer area of the second surface of the metal layer of the shield cover film that encloses the inner area, and wherein the fiber layer is in direct contact with the shield frame member.

23. The electronic device of claim 22, wherein the shield frame member, the fiber layer, and the shield cover film collectively shield the electronic component to mitigate electromagnetic interference associated with the electronic component.

* * * * *